(12) United States Patent
Yeh et al.

(10) Patent No.: US 10,188,004 B2
(45) Date of Patent: Jan. 22, 2019

(54) FOLDABLE DISPLAY DEVICE AND HOLDING STRUCTURE THEREOF

(71) Applicant: E Ink Holdings Inc., Hsinchu (TW)

(72) Inventors: Chia-Chun Yeh, Hsinchu (TW); Kuo-Hsing Cheng, Hsinchu (TW); Yi-Sheng Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/708,153

(22) Filed: Sep. 19, 2017

(65) Prior Publication Data

US 2018/0160553 A1 Jun. 7, 2018

(30) Foreign Application Priority Data

Dec. 1, 2016 (CN) .......................... 2016 1 1087958

(51) Int. Cl.
*H05K 5/00* (2006.01)
*H05K 5/02* (2006.01)

(52) U.S. Cl.
CPC ......... *H05K 5/0017* (2013.01); *H05K 5/0004* (2013.01); *H05K 5/0217* (2013.01); *H05K 5/0226* (2013.01)

(58) Field of Classification Search
None
See application file for complete search history.

(56) References Cited

U.S. PATENT DOCUMENTS

| | | | |
|---|---|---|---|
| 5,833,329 A | 11/1998 | Smith et al. | |
| 8,229,522 B2 | 7/2012 | Kim et al. | |
| 9,064,431 B2 * | 6/2015 | Ahn | G06F 1/1616 |
| 9,173,288 B1 * | 10/2015 | Kim | G06F 1/1633 |
| 9,250,733 B2 * | 2/2016 | Lee | H04M 1/02 |
| 9,348,450 B1 * | 5/2016 | Kim | G06F 1/1681 |
| 9,557,771 B2 * | 1/2017 | Park | G06F 1/1641 |
| 2012/0182740 A1 | 7/2012 | Vermeulen | |

(Continued)

FOREIGN PATENT DOCUMENTS

| | | |
|---|---|---|
| CN | 101798730 A | 8/2010 |
| TW | 201408178 A | 2/2014 |

(Continued)

OTHER PUBLICATIONS

Corresponding Taiwanese office action dated Jun. 26, 2017.

*Primary Examiner* — Courtney Smith
*Assistant Examiner* — Rashen E Morrison
(74) *Attorney, Agent, or Firm* — CKC & Partners Co., Ltd.

(57) ABSTRACT

A foldable display device includes a holding structure and a flexible display panel. The holding structure includes a soft outer housing, a first inner housing, a second inner housing, a first supporting stage, a second supporting stage, a first hinge, a first spring element, a second hinge, and a second spring element. The first hinge is connected to a same side of the first inner housing and the first supporting stage. The first spring element is connected to another same side of the first inner housing and the first supporting stage. The second hinge is connected to a same side of the second inner housing and the second supporting stage. The second spring element is connected to another same side of the second inner housing and the second supporting stage. The flexible display panel is located on the first and second supporting stages.

18 Claims, 5 Drawing Sheets

(56) References Cited

U.S. PATENT DOCUMENTS

| | | | | |
|---|---|---|---|---|
| 2014/0042293 A1* | 2/2014 | Mok | ............ | G06F 1/1652 |
| | | | | 248/682 |
| 2014/0111954 A1* | 4/2014 | Lee | ............ | G06F 1/1641 |
| | | | | 361/749 |
| 2015/0055287 A1* | 2/2015 | Seo | ............ | G06F 1/1652 |
| | | | | 361/679.27 |
| 2015/0153780 A1 | 6/2015 | Maatta et al. | | |
| 2015/0241925 A1* | 8/2015 | Seo | ............ | G06F 1/1652 |
| | | | | 361/679.27 |
| 2015/0366089 A1 | 12/2015 | Park et al. | | |
| 2016/0070303 A1* | 3/2016 | Lee | ............ | G06F 1/1616 |
| | | | | 361/679.27 |
| 2016/0378203 A1* | 12/2016 | Kim | ............ | G06F 1/1616 |
| | | | | 345/156 |

FOREIGN PATENT DOCUMENTS

| | | |
|---|---|---|
| TW | 201610643 A | 3/2016 |
| TW | 201632800 A | 9/2016 |

\* cited by examiner

FOLDABLE DISPLAY DEVICE AND HOLDING STRUCTURE THEREOF

RELATED APPLICATIONS

This application claims priority to China Application Serial Number 201611087958.4, Dec. 1, 2016, which is herein incorporated by reference.

BACKGROUND

Field of Invention

The present invention relates to a foldable display device and a holding structure of the foldable display device.

Description of Related Art

Since foldable display panels (such as electrophoretic display panels) have been presented to the public, foldable display devices have been available in the market of electronic products today. A foldable display device has a foldable housing, and a flexible display panel is disposed on the foldable housing. A user may spread or fold the display panel by unfolding or folding the housing. In general, the housing may have two portions that are connected by hinges, and the flexible display panel is disposed on two supporting stages that are respectively in the two portions of the housing, and the flexible display panel presents a spread state or a folded state in accordance with the housing that is unfolded or folded.

When the foldable display device is changed to a folded state from a spread state, a tensile stress may be formed by the foldable display panel in a crosswise and outward direction due to bending. In other words, the display panel is subjected to the tensile stress in a direction away from the supporting stages (i.e., a direction facing a user). The aforesaid tensile stress is exerted on an area of the display panel adjacent to a bending position. If an adhesive force between the display panel and the supporting stages is not strong enough, the display panel may be separated from the supporting stages of the housing. Alternatively, a stress concentration position of the tensile stress and the adhesive force may damage the display panel.

SUMMARY

An aspect of the present invention is to provide a foldable display device.

According to an embodiment of the present invention, a foldable display device includes a holding structure and a flexible display panel. The holding structure includes a soft outer housing, a first inner housing, a second inner housing, a first supporting stage, a second supporting stage, a first hinge, a first spring element, a second hinge, and a second spring element. The soft outer housing has an accommodating space therein. The first inner housing is located in the accommodating space. The second inner housing is located in the accommodating space, and a first gap is formed between the first inner housing and the second inner housing. The first supporting stage is located above the first inner housing. The second supporting stage is located above the second inner housing, and a second gap is formed between the first supporting stage and the second supporting stage. The first hinge is connected to a side of the first inner housing facing away from the first gap and a side of the first supporting stage facing away from the second gap. The first spring element is connected to a side of the first inner housing adjacent to the first gap, and a side of the first supporting stage adjacent to the second gap. The second hinge is connected to a side of the second inner housing facing away from the first gap, and a side of the second supporting stage facing away from the second gap. The second spring element is connected to a side of the second inner housing adjacent to the first gap, and a side of the second supporting stage adjacent to the second gap. The flexible display panel is located on the first supporting stage and the second supporting stage.

In one embodiment of the present invention, the second gap is narrower than the first gap.

In one embodiment of the present invention, the flexible display panel covers the second gap.

In one embodiment of the present invention, a position of the second gap corresponds to a position of the first gap.

In one embodiment of the present invention, the first spring element and the second spring element are springs or rubber pillars.

In one embodiment of the present invention, the first inner housing and the second inner housing are symmetrically disposed in the accommodating space, and the first supporting stage and the second supporting stage are symmetrically disposed in the accommodating space.

In one embodiment of the present invention, a third gap is formed between at least one portion of the first supporting stage and the first inner housing.

In one embodiment of the present invention, a third gap is formed between at least one portion of the second supporting stage and the second inner housing.

In one embodiment of the present invention, the soft outer housing has an opening, and the flexible display panel is located in the opening.

In one embodiment of the present invention, the flexible display panel is an electrophoretic display panel or an organic light-emitting diode display panel.

In one embodiment of the present invention, the soft outer housing is made of a material including leather, rubber, or plastic.

Another aspect of the present invention is to provide a holding structure.

According to an embodiment of the present invention, a holding structure includes a soft outer housing, a first inner housing, a second inner housing, a first supporting stage, a second supporting stage, a first hinge, a first spring element, a second hinge, and a second spring element. The soft outer housing has an accommodating space therein. The first inner housing is located in the accommodating space. The second inner housing is located in the accommodating space, and a first gap is formed between the first inner housing and the second inner housing. The first supporting stage is located above the first inner housing. The second supporting stage is located above the second inner housing, and a second gap is formed between the first supporting stage and the second supporting stage. The first hinge is connected to a side of the first inner housing facing away from the first gap, and a side of the first supporting stage facing away from the second gap. The first spring element is connected to a side of the first inner housing adjacent to the first gap, and a side of the first supporting stage adjacent to the second gap. The second hinge is connected to a side of the second inner housing facing away from the first gap, and a side of the second supporting stage facing away from the second gap. The second spring element is connected to a side of the second inner housing adjacent to the first gap, and a side of the second supporting stage adjacent to the second gap.

In one embodiment of the present invention, the soft outer housing has an opening, and the first supporting stage and the second supporting stage are exposed through the opening.

In the aforementioned embodiments of the present invention, because the first supporting stage is located above the first inner housing, and the first supporting stage and the first inner housing are connected to the first spring element through the first hinge, a side of the first supporting stage may pivot on the first hinge, and another side of the first supporting stage may stretch or compress the first spring element. Similarly, a side of the second supporting stage may pivot on the second hinge, and another side of the second supporting stage may stretch or compress the second spring element. When the foldable display device is changed to a folded state from a spread state, although a tensile stress may be formed by the flexible display panel in a crosswise and outward direction due to bending, the first and second spring elements have elastic forces and the first and second supporting stages are movable. Therefore, the effect of the tensile stress upon the flexible display panel may be reduced due to the elastic forces of the first and second spring elements, such that the difference of combined stress among the flexible display panel, the first and second supporting stages is reduced. As a result, the flexible display panel is prevented from separating from the first and second supporting stages, and is prevented from being damaged by a stress concentration position of the tensile stress and an adhesive force.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
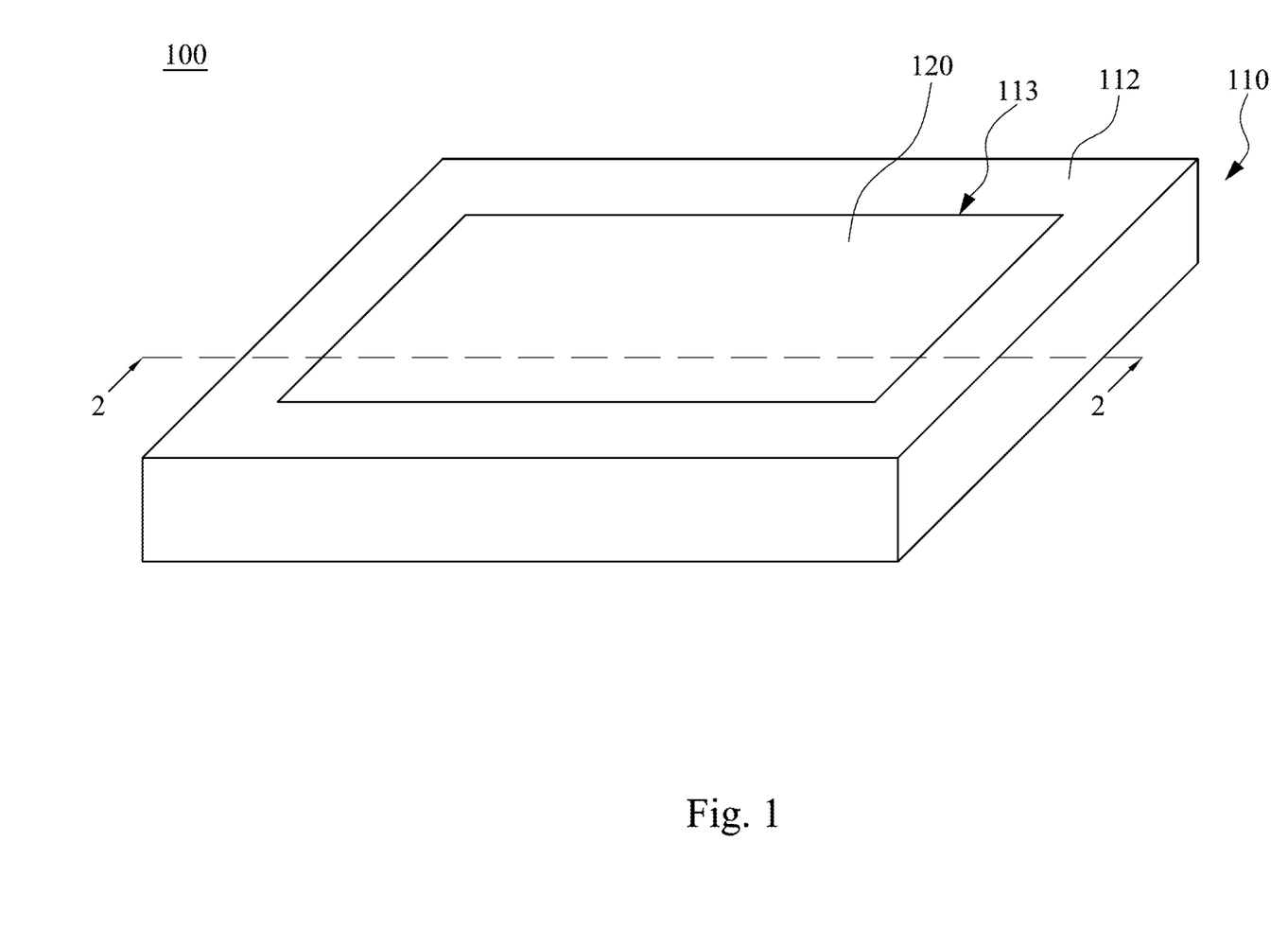
FIG. 1 is a perspective view of a foldable display device according to one embodiment of the present invention, in which the foldable display device is in a spread state.
Figure 2:
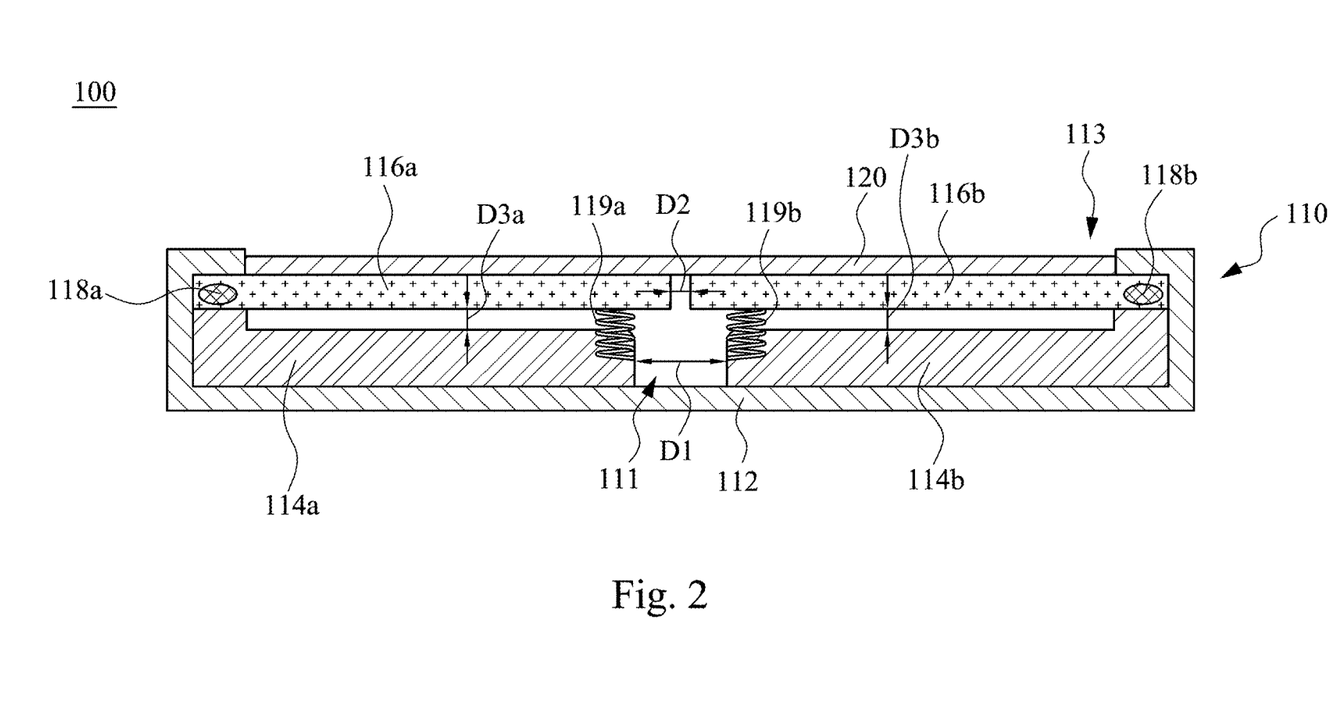
FIG. 2 is a cross-sectional view of the foldable display device taken along line 2-2 shown in FIG. 1.

FIG. 1 is a perspective view of a foldable display device 100 according to one embodiment of the present invention, in which the foldable display device 100 is in a spread state. FIG. 2 is a cross-sectional view of the foldable display device 100 taken along line 2-2 shown in FIG. 1. As shown in FIG. 1 and FIG. 2, the foldable display device 100 includes a holding structure 110 and a flexible display panel 120. The holding structure 110 may be utilized to support the flexible display panel 120. The holding structure 110 includes a soft outer housing 112, a first inner housing 114a, a second inner housing 114b, a first supporting stage 116a, a second supporting stage 116b, a first hinge 118a, a first spring element 119a, a second hinge 118b, and a second spring element 119b.

The soft outer housing 112 has an accommodating space 111 therein. The soft outer housing 112 has an opening 113, and the flexible display panel 120 is located in the opening 113. The soft outer housing 112 has flexibility, and may be made of a material including leather, rubber, or plastic. The flexible display panel 120 may be an electrophoretic display (EPD) panel or an organic light-emitting diode (OLED) display panel, but the present invention is not limited in this regard.

The first inner housing 114a and the second inner housing 114b are located in the accommodating space 111 of the soft outer housing 112, and a first gap D1 is formed between the first inner housing 114a and the second inner housing 114b. The first gap D1 may facilitate bending the soft outer housing 112 under the first gap D1. In this embodiment, the first inner housing 114a and the second inner housing 114b may be located on a bottom of the soft outer housing 112, and the first inner housing 114a and the second inner housing 114b are respectively abutted against two opposite sidewalls of the soft outer housing 112, such that the first inner housing 114a and the second inner housing 114b are symmetrically disposed in the accommodating space 111.

The first supporting stage 116a and the second supporting stage 116b are located in the accommodating space 111 of the soft outer housing 112. The first supporting stage 116a is located above the first inner housing 114a, and the second supporting stage 116b is located above the second inner housing 114b. A second gap D2 is formed between the first supporting stage 116a and the second supporting stage 116b. In this embodiment, the first supporting stage 116a and the second supporting stage 116b are symmetrically disposed in the accommodating space 111.

The flexible display panel 120 is located on the first supporting stage 116a and the second supporting stage 116b, and covers the second gap D2. The second gap D2 may facilitate bending the flexible display panel 120 above the second gap D2. In addition, when the holding structure 110 does not carry the flexible display panel 120, the first supporting stage 116a and the second supporting stage 116b are exposed through the opening 113 of the soft outer housing 112. Furthermore, in other embodiments, the holding structure 110 may be utilized to carry other flexible objects, such as a photograph, a paper, a metal sheet, leather, cloth, etc., and the present invention is not limited in this regard.

Moreover, the first hinge 118a is connected to a side of the first inner housing 114a facing away from the first gap D1, and is connected to a side of the first supporting stage 116a facing away from the second gap D2. In other words, as shown in FIG. 2, the first hinge 118a is connected to the left side of the first inner housing 114a and the left side of the first supporting stage 116a. Two ends of the first spring element 119a are respectively connected to a side of the first inner housing 114a adjacent to the first gap D1 and a side of the first supporting stage 116a adjacent to the second gap D2. In other words, as shown in FIG. 2, the first spring element 119a is connected to the right side of the first inner housing 114a and the right side of the first supporting stage 116a. As a result of such a configuration, when the first supporting stage 116a is subjected to a force, the first spring element 119a may be compressed or stretched, and the first supporting stage 116a may be pivoted above the first inner housing 114a through the first hinge 118a. In this embodiment, a third gap D3a is formed between at least one portion of the first supporting stage 116a and the first inner housing 114a.

Similarly, the second hinge 118b is connected to a side of the second inner housing 114b facing away from the first gap D1, and is connected to a side of the second supporting stage 116b facing away from the second gap D2. In other words, as shown in FIG. 2, the second hinge 118b is connected to the right side of the second inner housing 114b and the right side of the second supporting stage 116b. Two ends of the second spring element 119b are respectively connected to a side of the second inner housing 114b adjacent to the first gap D1 and a side of the second supporting stage 116b adjacent to the second gap D2. In other words, as shown in FIG. 2, the second spring element 119b is connected to the left side of the second inner housing 114b and the left side of the second supporting stage 116b. When the second supporting stage 116b is subjected to a force, the second spring element 119b may be compressed or stretched, and the second supporting stage 116b may be pivoted above the second inner housing 114b through the second hinge 118b. In this embodiment, a third gap D3b is formed between at least one portion of the second supporting stage 116b and the second inner housing 114b.

In this embodiment, the first spring element 119a and the second spring element 119b may be springs, but the present invention is not limited in this regard. Other elastic materials may also be used as the first spring element 119a and the second spring element 119b, such as rubber, silicone, or soft plastic.

It is to be noted that the connection relationships and materials of the aforementioned elements will not be described again in the following description. In the following description, a different state of using the foldable display device 100 will be described.

Figure 3:
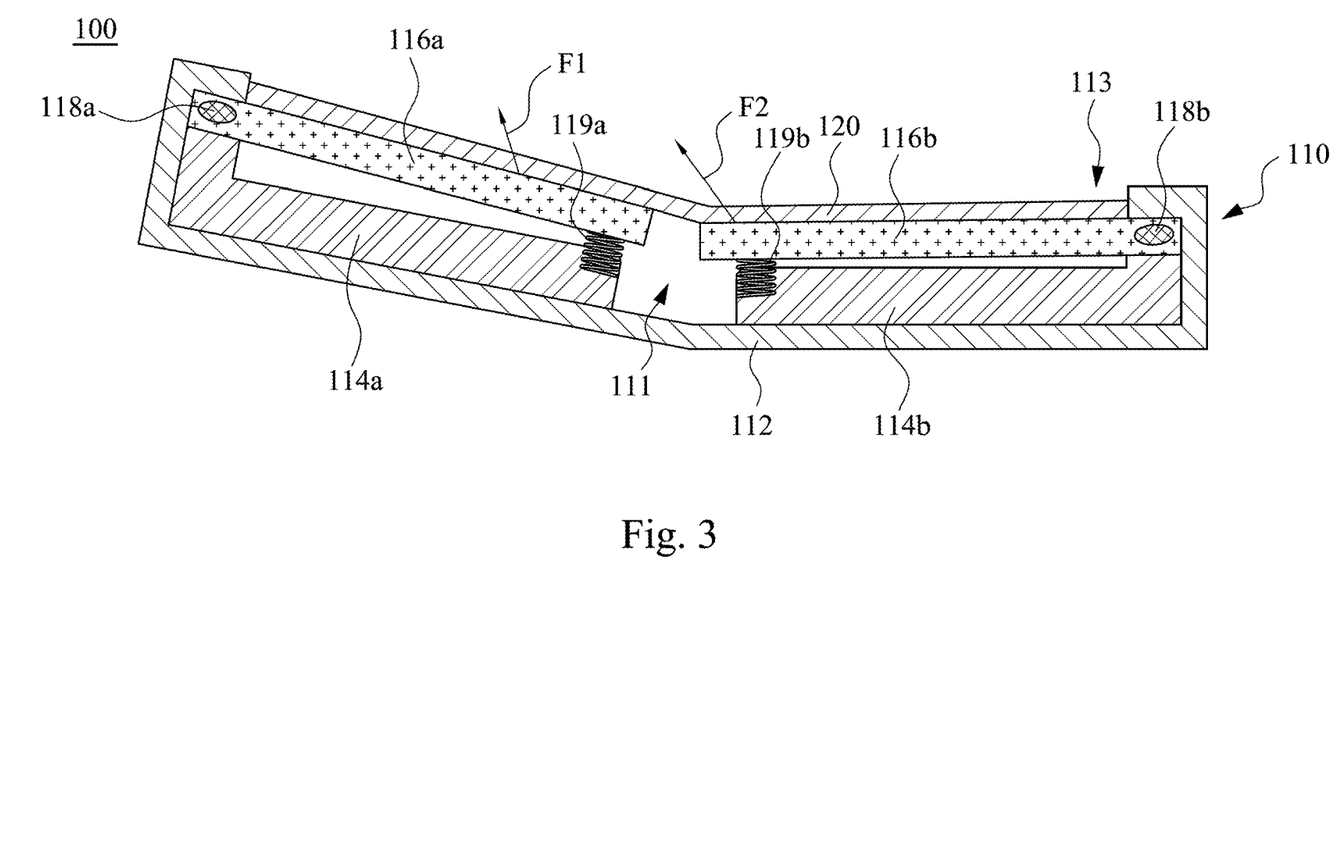
FIG. 3 is a cross-sectional view of the foldable display device shown in FIG. 2 when being changed to a folded state from a spread state.

FIG. 3 is a cross-sectional view of the foldable display device 100 shown in FIG. 2 when being changed to a folded state from a spread state. As shown in FIG. 2 and FIG. 3, a position of the second gap D2 corresponds to a position of the first gap D1, and the second gap D2 is narrower than the first gap D1. As a result of such a configuration, not only the first supporting stage 116a and the second supporting stage 116b may provide enough support forces for the flexible display panel 120, but also the first gap D1 may provide an enough bending area for the soft outer housing 112 when the foldable display device 100 is changed to a folded state from a spread state. Hence, in a folded step, the first inner housing 114a and the second inner housing 114b are prevented from interfering with each other to cause the folded step not smooth.

Figure 4:
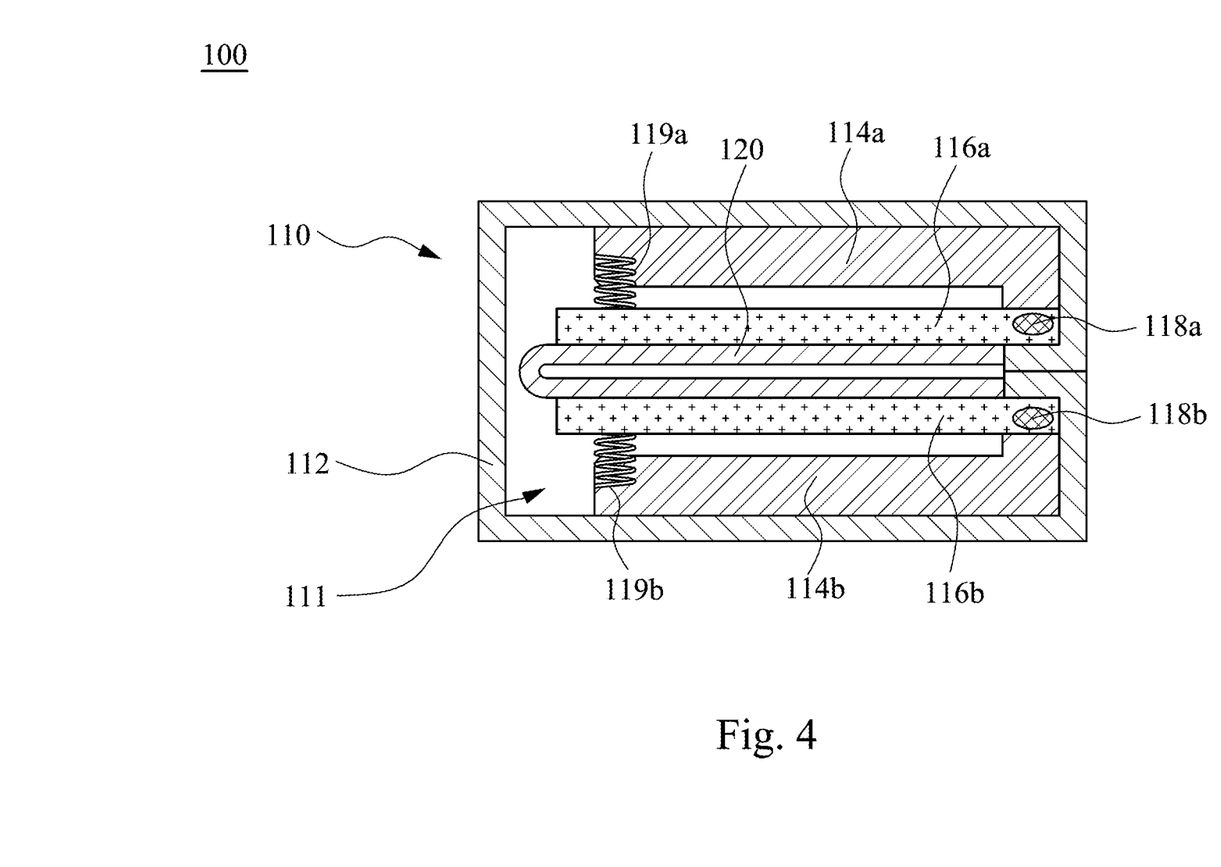
FIG. 4 is a cross-sectional view of the foldable display device shown in FIG. 2 when being in a folded state.

FIG. 4 is a cross-sectional view of the foldable display device 100 shown in FIG. 2 when being in a folded state. As shown in FIG. 3 and FIG. 4, a side (left side) of the first supporting stage 116a may be pivoted through the first hinge 118a, and another side (right side) of the first supporting stage 116a may stretch or compress the first spring element 119a. Similarly, a side (right side) of the second supporting stage 116b may be pivoted through the second hinge 118b, and another side (left side) of the second supporting stage 116b may stretch or compress the second spring element 119b. When the foldable display device 100 is changed to a folded state from a spread state, although the flexible display panel 120 may form tensile stresses F1, F2 in a crosswise and outward (upward) direction due to bending, the first and second spring elements 119a, 119b may be compressed to have elastic forces and the first and second supporting stages 116a, 116b are movable. Therefore, the effect of the tensile stresses F1, F2 upon the flexible display panel 120 may be reduced due to the elastic forces of the first and second spring elements 119a, 119b, such that the difference of combined stress among the flexible display panel 120, the first and second supporting stages 116a, 116b is reduced.

For example, when the first and second spring elements 119a, 119b are compressed, the elastic forces of the first and second spring elements 119a, 119b may respectively support the first and second supporting stages 116a, 116b, thereby preventing the first and second supporting stages 116a, 116b from having excessive pivoting angles.

As a result, the flexible display panel 120 is prevented from separating from the first and second supporting stages 116a, 116b. Alternatively, the flexible display panel 120 is prevented from being damaged by a stress concentration position of the tensile stresses F1, F2 and an adhesive force that is between the first and second supporting stages 116a, 116b.

Figure 5:
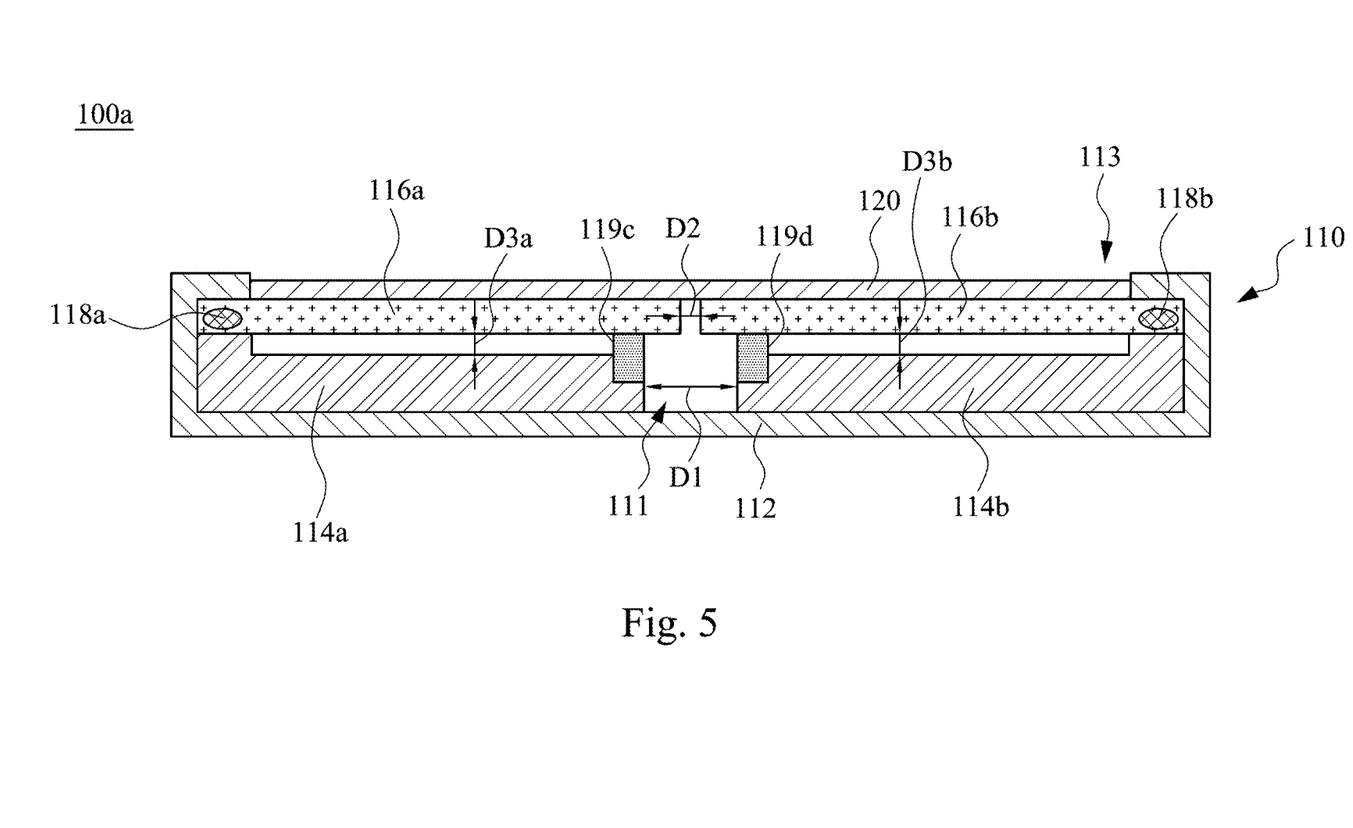
FIG. 5 is a cross-sectional view of a foldable display device according to one embodiment of the present invention, in which the foldable display device is in a spread state.

FIG. 5 is a cross-sectional view of a foldable display device 100a according to one embodiment of the present invention, in which the foldable display device 100a is in a spread state. As shown in FIG. 5, the foldable display device 100a includes the holding structure 110 and the flexible display panel 120. The holding structure 110 includes the soft outer housing 112, the first inner housing 114a, the second inner housing 114b, the first supporting stage 116a, the second supporting stage 116b, the first hinge 118a, a first spring element 119c, the second hinge 118b, and a second spring element 119d. The difference between this embodiment and the embodiment shown in FIG. 2 is that the first spring element 119c and the second spring element 119d are rubber pillars, not springs.

As a result of such a design, when the foldable display device 100a is changed to a folded state from a spread state, since the first and second spring elements 119c, 119d may be compressed to have elastic forces and the first and second supporting stages 116a, 116b are movable, the effect of a tensile stress upon the flexible display panel 120 may be reduced due to the elastic forces of the first and second spring elements 119c, 119d, such that the difference of combined stress among the flexible display panel 120, the first and second supporting stages 116a, 116b is reduced. Hence, the flexible display panel 120 is prevented from separating from the first and second supporting stages 116a, 116b. Alternatively, the flexible display panel 120 is prevented from being damaged by a stress concentration position of the tensile stress and an adhesive force.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A foldable display device, comprising:
   a holding structure, comprising:
      a soft outer housing having an accommodating space therein;

a first inner housing located in the accommodating space, wherein an entire bottom surface and an entire sidewall of the first inner housing are covered by the soft outer housing;

a second inner housing located in the accommodating space, wherein a first gap is formed between the first inner housing and the second inner housing, and an entire bottom surface and an entire sidewall of the second inner housing are covered by the soft outer housing;

a first supporting stage above the first inner housing, wherein a third gap is formed between at least one portion of the first supporting stage and the first inner housing;

a second supporting stage above the second inner housing, wherein a second gap is formed between the first supporting stage and the second supporting stage;

a first hinge connected at a location near one end of the first inner housing, and connected at a end opposite of where the first gap is located;

a first spring element connected to a side of the first inner housing adjacent to the first gap, and connected to a side of the first supporting stage adjacent to the second gap;

a second hinge connected at a location near one end of the second inner housing, and connected at an end opposite of where the first gap is located; and a second spring element connected to a side of the second inner housing adjacent to the first gap, and connected to a side of the second supporting stage adjacent to the second gap; and a flexible display panel located on the first supporting stage and the second supporting stage.

2. The foldable display device of claim 1, wherein the second gap is narrower than the first gap.

3. The foldable display device of claim 1, wherein the flexible display panel covers the second gap.

4. The foldable display device of claim 1, wherein a position of the second gap corresponds to a position of the first gap.

5. The foldable display device of claim 1, wherein the first spring element and the second spring element are springs or rubber pillars.

6. The foldable display device of claim 1, wherein the first inner housing and the second inner housing are symmetrically disposed in the accommodating space, and the first supporting stage and the second supporting stage are symmetrically disposed in the accommodating space.

7. The foldable display device of claim 1, wherein another third gap is formed between at least one portion of the second supporting stage and the second inner housing.

8. The foldable display device of claim 1, wherein the soft outer housing has an opening, and the flexible display panel is located in the opening.

9. The foldable display device of claim 1, wherein the flexible display panel is an electrophoretic display panel or an organic light-emitting diode display panel.

10. The foldable display device of claim 1, wherein the soft outer housing is made of a material comprising leather, rubber, or plastic.

11. A holding structure, comprising:

a soft outer housing having an accommodating space therein;

a first inner housing located in the accommodating space, wherein an entire bottom surface and an entire sidewall of the first inner housing are covered by the soft outer housing;

a second inner housing located in the accommodating space, wherein a first gap is formed between the first inner housing and the second inner housing, and an entire bottom surface and an entire sidewall of the second inner housing are covered by the soft outer housing;

a first supporting stage above the first inner housing, wherein a third gap is formed between at least one portion of the first supporting stage and the first inner housing;

a second supporting stage above the second inner housing, wherein a second gap is formed between the first supporting stage and the second supporting stage;

a first hinge connected at a location near one end of the first inner housing, and connected at an end opposite of where the first gap is located;

a first spring element connected to a side of the first inner housing adjacent to the first gap, and connected to a side of the first supporting stage adjacent to the second gap;

a second hinge connected at a location near one end of the second inner housing, and connected at an end opposite of where the first gap is located; and a second spring element connected to a side of the second inner housing adjacent to the first gap, and connected to a side of the second supporting stage adjacent to the second gap.

12. The holding structure of claim 11, wherein the second gap is narrower than the first gap.

13. The holding structure of claim 11, wherein a position of the second gap corresponds to a position of the first gap.

14. The holding structure of claim 11, wherein the first spring element and the second spring element are springs or rubber pillars.

15. The holding structure of claim 11, wherein the first inner housing and the second inner housing are symmetrically disposed in the accommodating space, and the first supporting stage and the second supporting stage are symmetrically disposed in the accommodating space.

16. The holding structure of claim 11, wherein a third gap is formed between at least one portion of the second supporting stage and the second inner housing.

17. The holding structure of claim 11, wherein the soft outer housing has an opening, and the first supporting stage and the second supporting stage are exposed through the opening.

18. The holding structure of claim 11, wherein the soft outer housing is made of a material comprising leather, rubber, or plastic.

* * * * *